(12) United States Patent
Wu

(10) Patent No.: US 8,013,258 B2
(45) Date of Patent: Sep. 6, 2011

(54) SHIELDING DEVICE

(75) Inventor: Wen-Chou Wu, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 159 days.

(21) Appl. No.: 12/136,785

(22) Filed: Jun. 11, 2008

(65) Prior Publication Data

US 2009/0308653 A1      Dec. 17, 2009

(51) Int. Cl.
*H05K 9/00* (2006.01)
(52) U.S. Cl. ........................ 174/382; 361/816
(58) Field of Classification Search .................. 174/350, 174/377, 382; 361/816, 818
See application file for complete search history.

(56) References Cited

U.S. PATENT DOCUMENTS

| | | | | |
|---|---|---|---|---|
| 4,891,468 | A * | 1/1990 | Andrae | 174/392 |
| 6,370,033 | B1 * | 4/2002 | Saegusa et al. | 361/777 |
| 7,087,835 | B2 | 8/2006 | Ziberna | |
| 2002/0185294 | A1 * | 12/2002 | Shlyakhtichman et al. | 174/52.1 |
| 2009/0080172 | A1 * | 3/2009 | Arslan et al. | 361/816 |

FOREIGN PATENT DOCUMENTS

CN    101162797 A    4/2008

OTHER PUBLICATIONS

Shahparnia et al., Electromagnetic Interference (EMI) Reduction From Printed Circuit Boards (PCB) Using Electromagnetic Bandgap Structures, IEEE Transcations on Electromagnetic Compatibility, vol. 46, No. 4, Nov. 2004.
Yang et al., A Novel TEM Waveguide Using Uniplanar Compact Photonic-Bandgap (UC-PBG) Structure, IEEE Transcations on Microwave Theory and Techniques, vol. 47, No. 11, Nov. 1999.
Mohajer-Iravani et al., Coupling Reduction in Enclosures and Cavities Using Electromagnetic Band Gap Structures, IEEE Transactions on Electromagnetic Compatibility, vol. 48, No. 2, May 2006.
Zhang et al., A Double-Surface Electromagnetic Bandgap Structure With One Surface Embedded in Power Plane for Ultra-Wideband SSN Suppression, IEEE Microwave and Wireless Components Letters, vol. 17, No. 10, Oct. 2007.
Baharak Mohajer-Iravani and Omar M. Ramahi, Suppression of EMI and Electromagnetic Noise in Packages Using Embedded Capacitance and Miniaturized Electromagnetic Bandgap Structures With High-k Dielectrics, IEEE Transactions on Advanced Packaging, vol. 30, No. 4, Nov. 2007.
Choi et al., A Novel Electromagnetic Bandgap (EBG) Structure for Mixed-Signal System Applications,2004.
Wu et al., Electromagnetic Bandgap Power/Ground Planes for Wideband Suppression of Ground Bounce Noise and Radiated Emission in High-Speed Circuits, IEEE Transactions on Microwave Theory and Techniques, vol. 53, No. 9, Sep. 2005.
Abhari et al., Metallo-Dielectric Electromagnetic Bandgap Structures for Suppression and Isolation of the Parallel-Plate Noise in High-Speed Circuits, IEEE Transactions on Microwave Theory and Techniques, vol. 51, No. 6, Jun. 2003.
Zhang et al., A Power Plane With Wideband SSN Suppression Using a Multi-Via Electromagnetic Bandgap Structure, IEEE Microwave and Wireless Components Letters, vol. 17, No. 4, Apr. 2007.

(Continued)

*Primary Examiner* — Hung Ngo
(74) *Attorney, Agent, or Firm* — Winston Hsu; Scott Margo

(57) ABSTRACT

A shielding device for serving as an electromagnetic shield includes a shield body having a top piece and a plurality of sidewall pieces, and an electromagnetic band-gap (EBG) structure disposed on the top piece of the shield body.

23 Claims, 9 Drawing Sheets

OTHER PUBLICATIONS

Coccioli et al., Aperture-Coupled Patch Antenna on UC-PBG Substrate, IEEE Transactions on Microwave Theory and Techniques, vol. 47, No. 11, Nov. 1999.

Shahrooz Shahparnia and Omar M. Ramahi; Electromagnetic Interference (EMI) Reduction From Printed Circuit Boards (PCB) Using Electromagnetic Bandgap Structures, Nov. 2004.

* cited by examiner

SHIELDING DEVICE

BACKGROUND OF THE INVENTION

1. Field of the Invention

The present invention relates generally to a shielding device served to shield electronic components in wireless communication apparatuses and, more particularly, to a shielding case that is capable of mitigating interference between the electronic components that are shielded by the same shielding case.

2. Description of the Prior Art

Modern day wireless communication apparatuses such as cellular phones or GPS tracking systems are becoming more and more complex as technology develops. Consumers demand smaller devices that still maintain good reception, high overall performance and large frequency range. Component placement is crucially important at RF frequencies, as interference from various components can hinder or block reception of signals. To avoid as much as possible any unwanted influence of electromagnetic radiation from devices such as RF power amplifiers or baseband chips, it is known to shield such radiation sources by encasing the radiation sources in metallic shielding cases.

However, when the RF transceiver and the RF power amplifier, which are mounted on the same printed circuit board (PCB) in a wireless communication apparatus, are encased together by only one shielding case, a so-called power amplifier (PA) pulling effect easily occurs in direct-conversion transmitter (DCT) architecture. It is believed that the PA pulling effect is caused by the higher-order harmonics power originated from the RF power amplifier, which adversely affects the signal integrity of synthesizer within the same frequency channel. As a result, the RF transceiver and the RF power amplifier are typically covered with two independent shielding cases, respectively, in order to prevent the PA pulling effect.

There is a need in this industry to reduce the manufacturing cost by using single shielding case instead of multiple shielding cases on a PCB to encase the RF transceiver and the RF power amplifier in one enclosed space. The challenge is how to suppress the PA harmonic power.

SUMMARY OF THE INVENTION

Accordingly, it is one object of this invention to provide an improved shielding device that is capable of mitigating the PA pulling effect.

It is another object of this invention to provide a printed circuit board with shielding protection, in which the number of shielding case utilized can be decreased, thereby saving the manufacturing cost.

According to one aspect of the invention, there is provided a shielding device having a shield body and the electromagnetic band-gap (EBG) structure which is capable of preventing propagation of electromagnetic wave within a frequency band. The shield body has a top piece and a plurality of sidewall pieces. The EBG structure is disposed on the top piece, and the EBG structure is arranged to modify the resonant modes of the shield body within a range of frequencies.

According to still another aspect of the invention, there is provided a printed circuit board with shielding protection, which has a substrate; an electronic component; and a shielding device. The shielding device includes a shield body having a top piece and a plurality of sidewall pieces, and the top piece and the plurality of sidewall pieces define a covering space for shielding the electronic components on a printed circuit board (PCB); and an electromagnetic band-gap (EBG) structure on the top piece, the EBG structure comprising a periodic pattern capable of preventing propagation of electromagnetic wave within a range of frequencies.

These and other objectives of the present invention will no doubt become obvious to those of ordinary skill in the art after reading the following detailed description of the preferred embodiment that is illustrated in the various figures and drawings.

DETAILED DESCRIPTION

The shielding device according to this invention may be applied to various wireless communication apparatuses including but not limited to Global Positioning System (GPS) and handheld communication devices such as cellular phones. Without the intention of a limitation, the invention will now be described and illustrated with the reference to several embodiments.

Figure 1:
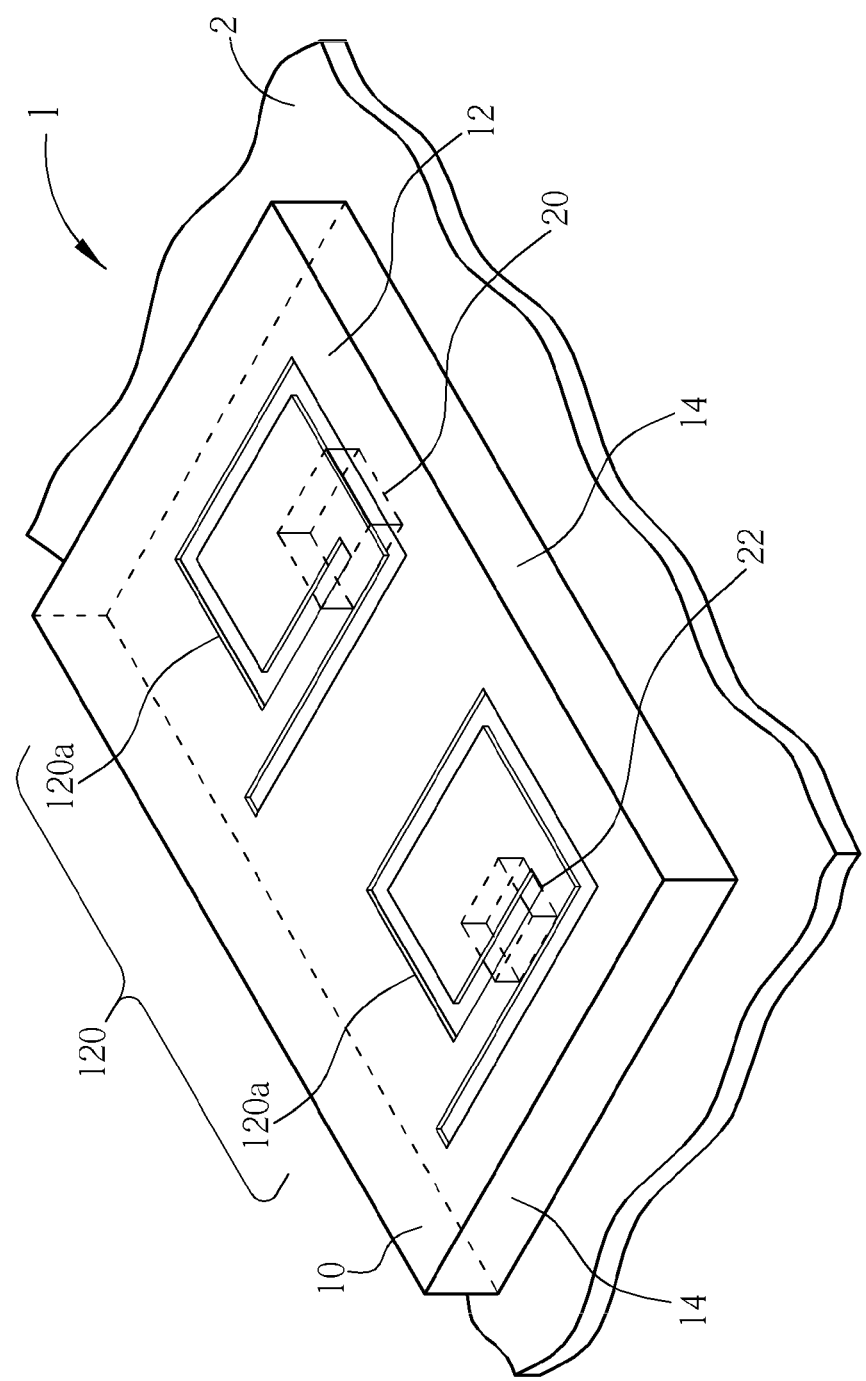
FIG. 1 is a schematic, perspective diagram showing a shielding device and a portion of a printed circuit board (PCB) covered by the shielding device in accordance with one embodiment of the invention.

FIG. 1 is a schematic, perspective diagram illustrating a shielding device in accordance with one embodiment of the invention. The shielding device 1 includes a monolithic shield body 10 having a top piece 12 and four sidewall pieces 14. In this embodiment, the top piece 12 and sidewall pieces 14 are in the form of plates. The shield body 10 is a downwardly opened, box-like structure. The top piece 12 and the sidewall pieces 14 define a single covering space (or single compartment) 101 for shielding at least two radio frequency (RF) electronic components 20 and 22 that are mounted on a printed circuit board (PCB) 2. For example, the RF electronic component 20 may be an RF power amplifier and the RF electronic component 22 may be an RF transceiver. In another case, the RF electronic component 22 may be embedded in an SOC chip, which further comprises a baseband circuit. For the sake of simplicity, merely the RF electronic components 20 and 22 are shown while the other parts on the PCB 2 such as antenna or circuit traces are omitted. As previously mentioned, the higher-order harmonics power originated from the RF power amplifier adversely affects the signal integrity of RF transceiver of synthesizer within the same frequency channel.

The shield body 10 may be manufactured by one piece of sheet metal by common manufacturing techniques including but not limited to stamping, folding and drawing. Moreover, in one example, the shield body 10 can be electrically connected to a ground plane (not shown) of the PCB 2, e.g. a system ground. The shielding device 1 may be affixed on a selected portion of the PCB 2 using methods known in the art, for example, soldering, welding, bonding, gluing or other suitable affixation means. In addition, the shielding device 1 may be a one-piece structure or a multiple-piece structure. In a case that the shielding device 1 is a two-piece structure, a receiving member may be provided to fit to the shield body 10. For example, the receiving member may have legs penetrating through corresponding slits formed in the PCB 2, which engage with the shield body 10.

An electromagnetic band-gap (EBG) structure 120 is provided on the top piece 12 of the shield body 10 for mitigating electromagnetic interference between the RF electronic components 20 and 22 that are both placed within and shielded by the same covering space 101 of the shielding device 1. In general, the EBG structure can satisfy a perfect magnetic conductor (PMC) boundary condition over a certain frequency band.

A typical EBG structure, the simplest of them for example, is characterized by periodic vias connected together through a metallic surface, and metallic patches on the top of these vias. The whole structure acts as a band-stop filter by suppressing surface waves within a range of frequencies. This frequency range is a function of the geometrical features of the structure (such as periodicity, patch size, gap size, via diameter and via length) as well as the dielectric material between the patch. In practice, a relationship between the geometrical features of the EBG structure and the center frequency may be not easy to be represented by a simple equation, but still can be obtained using, for example, adaptive estimation.

According to the embodiment of this invention, the EBG structure 120 comprises periodic spiral openings 120a capable of preventing propagation of electromagnetic noise within a range of frequencies. It is understood that the number of the spiral openings 120a is merely exemplary and other numbers of the spiral openings 120a may be used for the same purpose. The aforesaid frequency range is a function of the geometrical features of the EBG structure 120 such as periodicity, opening size, and relative position.

Figure 2:
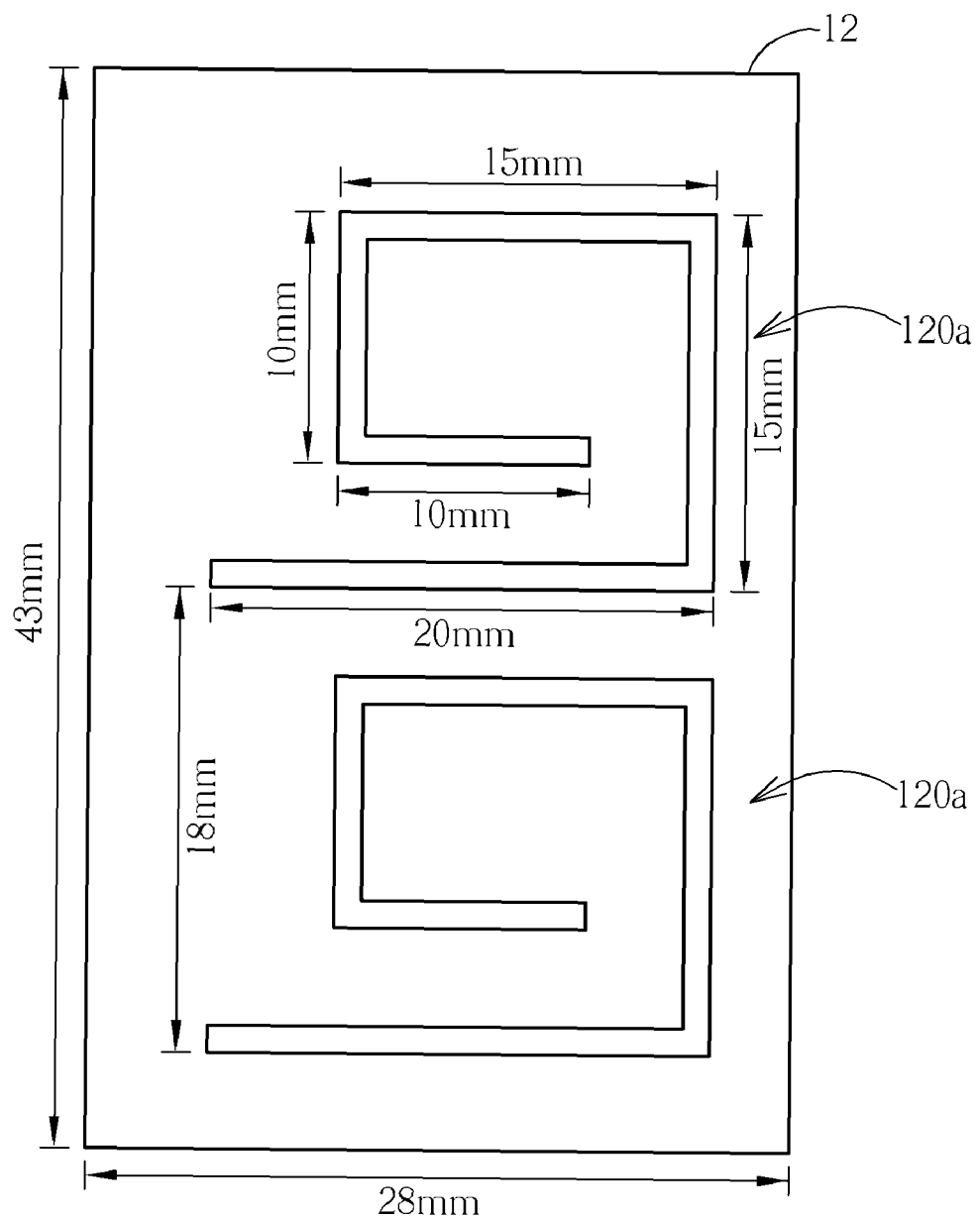
FIG. 2 and FIG. 3 are top views of the top piece of the shield body according to this invention.
Figure 3:
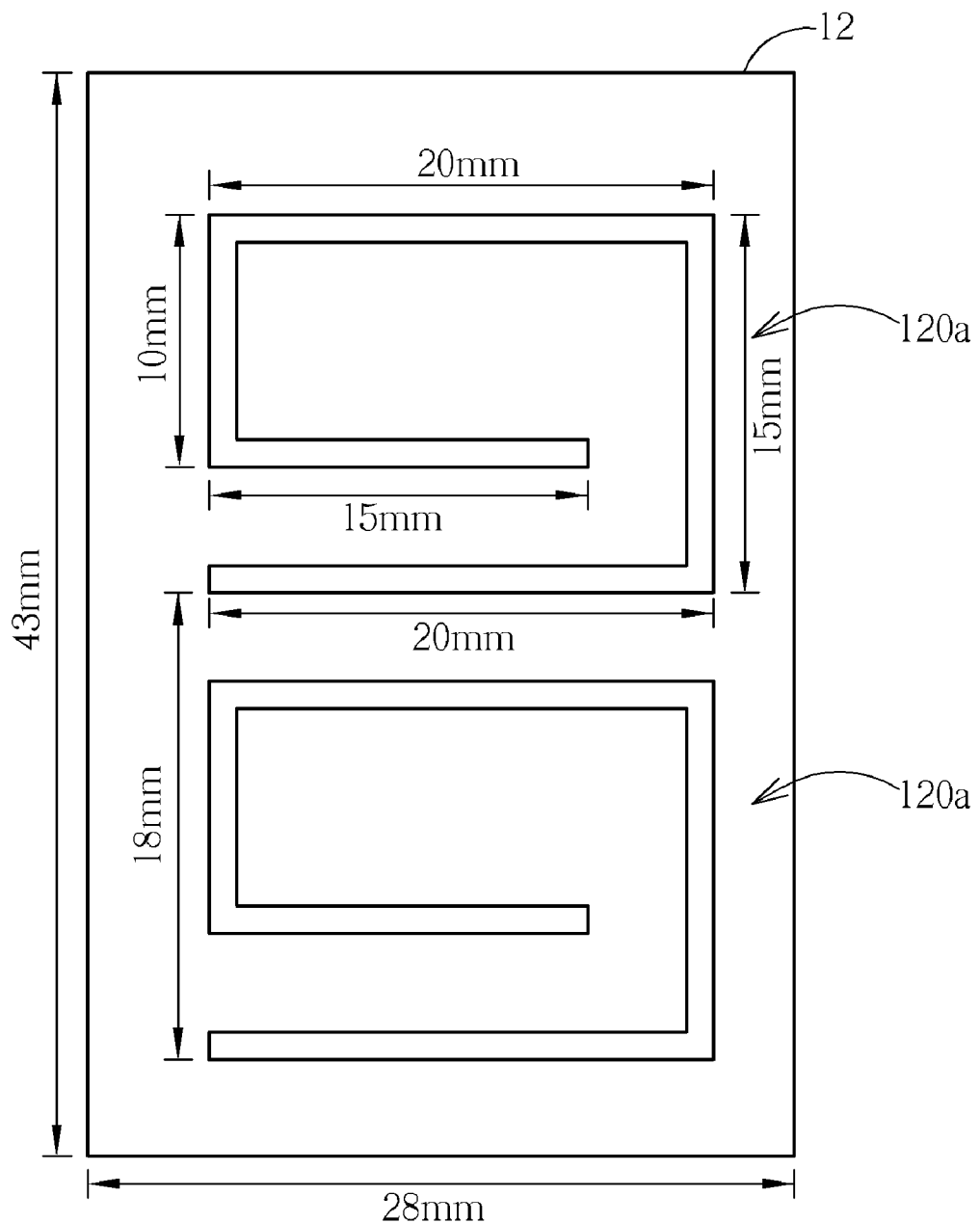

Some exemplary dimensions of the periodic spiral openings 120a according to the embodiments are shown in FIG. 2 and FIG. 3. The embodiments illustrated in FIG. 2 and FIG. 3, whose top views of the top piece 12 of the shield body 10 are respectively shown, are different in their filtering levels with respect to frequencies. The term "periodic" may include the following meanings: (1) two identical shapes arranged together to form a periodic pattern as depicted in FIG. 1; and (2) the periodic change of one single shape, for example, one single spiral shape which emanates from a central point, getting progressively farther away as it revolves around the central point, or a battlement-like shape in which portions have been cut out at intervals.

Figure 4:
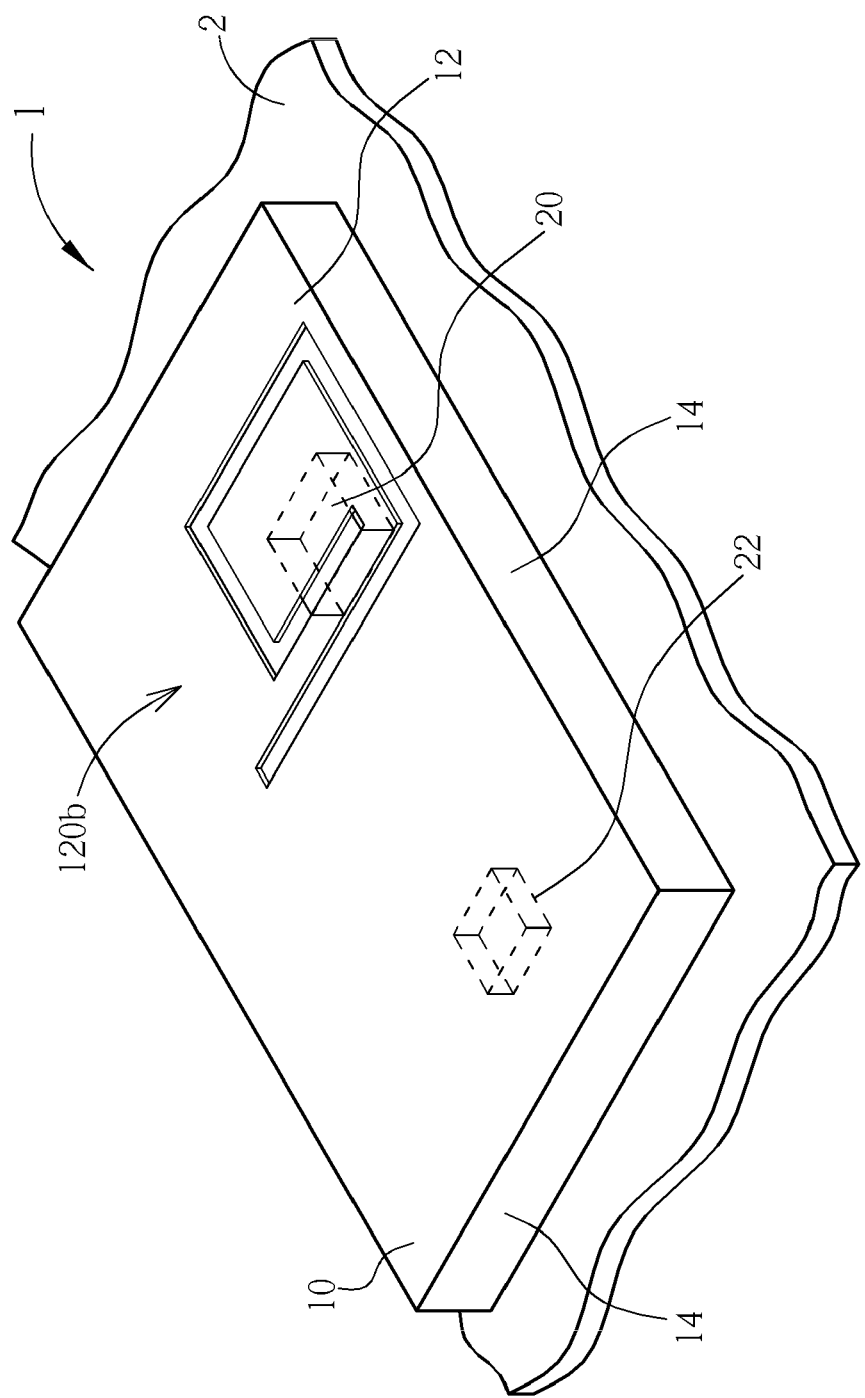
FIGS. 4-7 are some exemplary EBG patterns on the shield body according to some embodiments of this invention.
Figure 5:
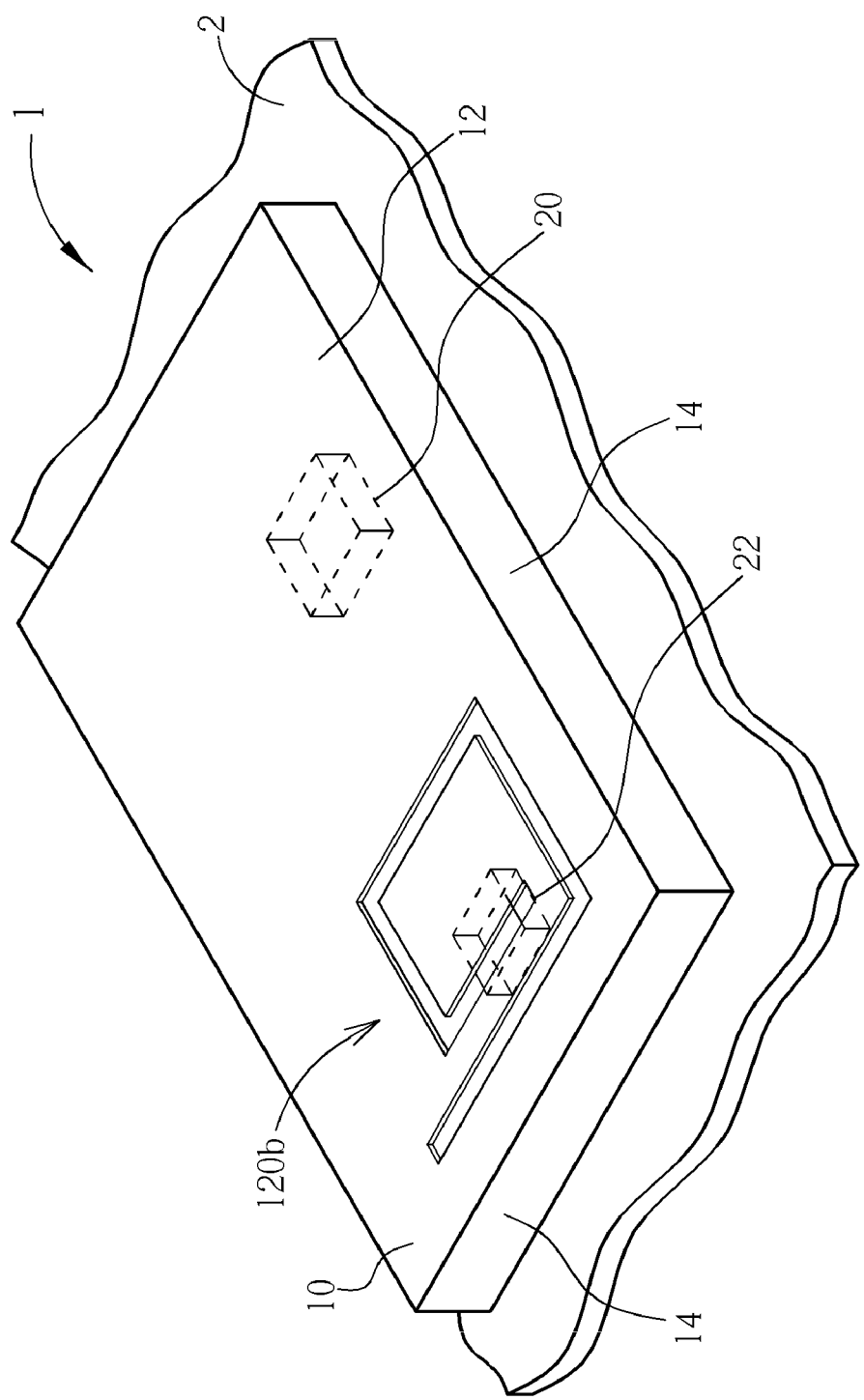

FIGS. 4-7 are some exemplary EBG structures on the shield body 10 according to some embodiments of this invention. As shown in FIG. 4, only one spiral opening 120b is provided on the top piece 12 of the shield body 10 and the spiral opening 120b is situated directly above the RF electronic component 20 that is mounted on the PCB 2. As shown in FIG. 5, likewise, only one spiral opening 120b is provided on the top piece 12 of the shield body 10. The spiral opening 120b is situated directly above the RF electronic component 22 that is mounted on the PCB 2. As mentioned above, the RF electronic component 20 may be an RF power amplifier, and the RF electronic component 22 may be an RF transceiver. That is, the EBG structure, such as the spiral opening 120b can be situated above the RF power amplifier, the RF transceiver, or other RF electronic component which may suffer or induce the PA pulling effect.

Figure 6:
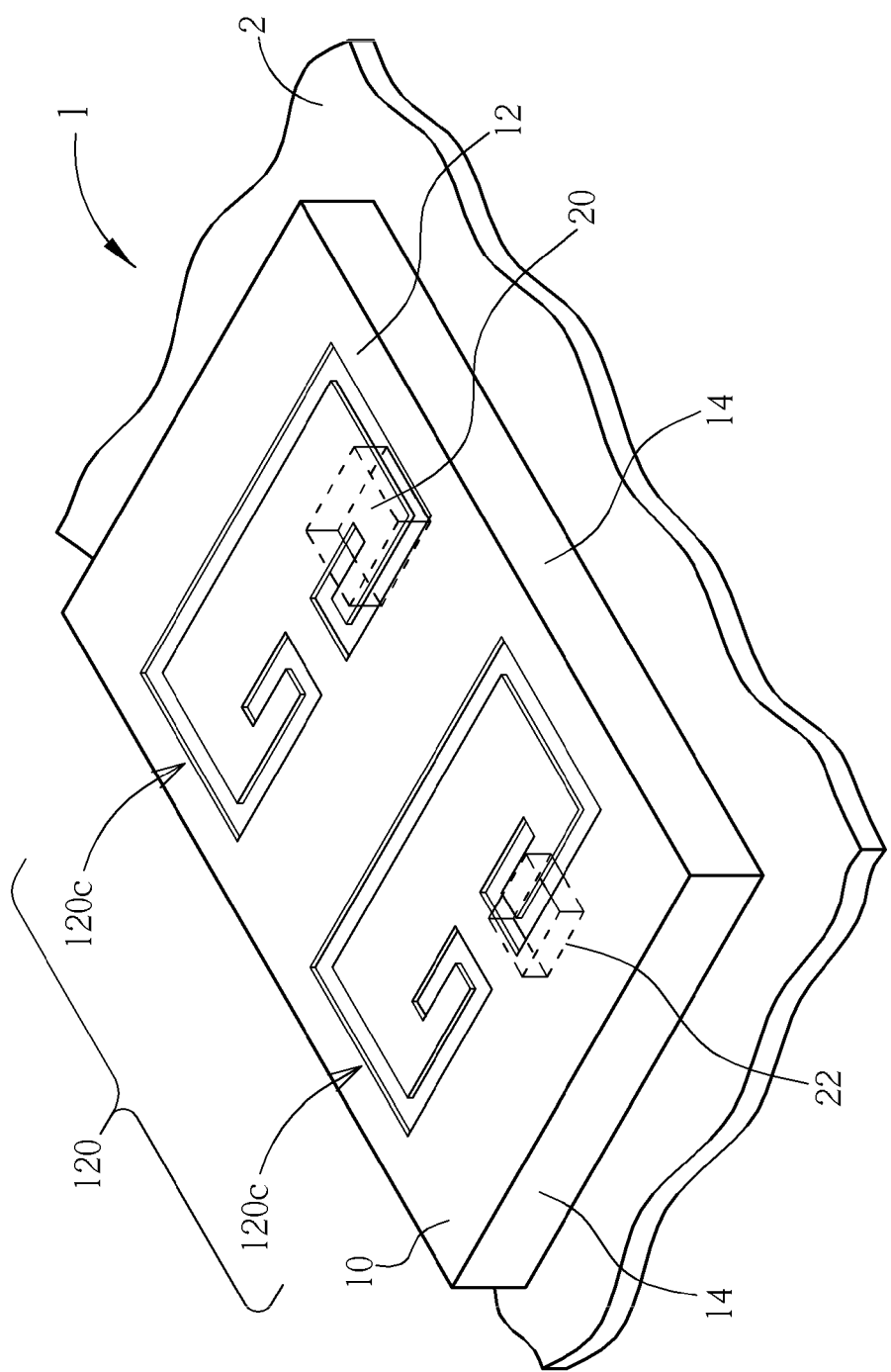
Figure 7:
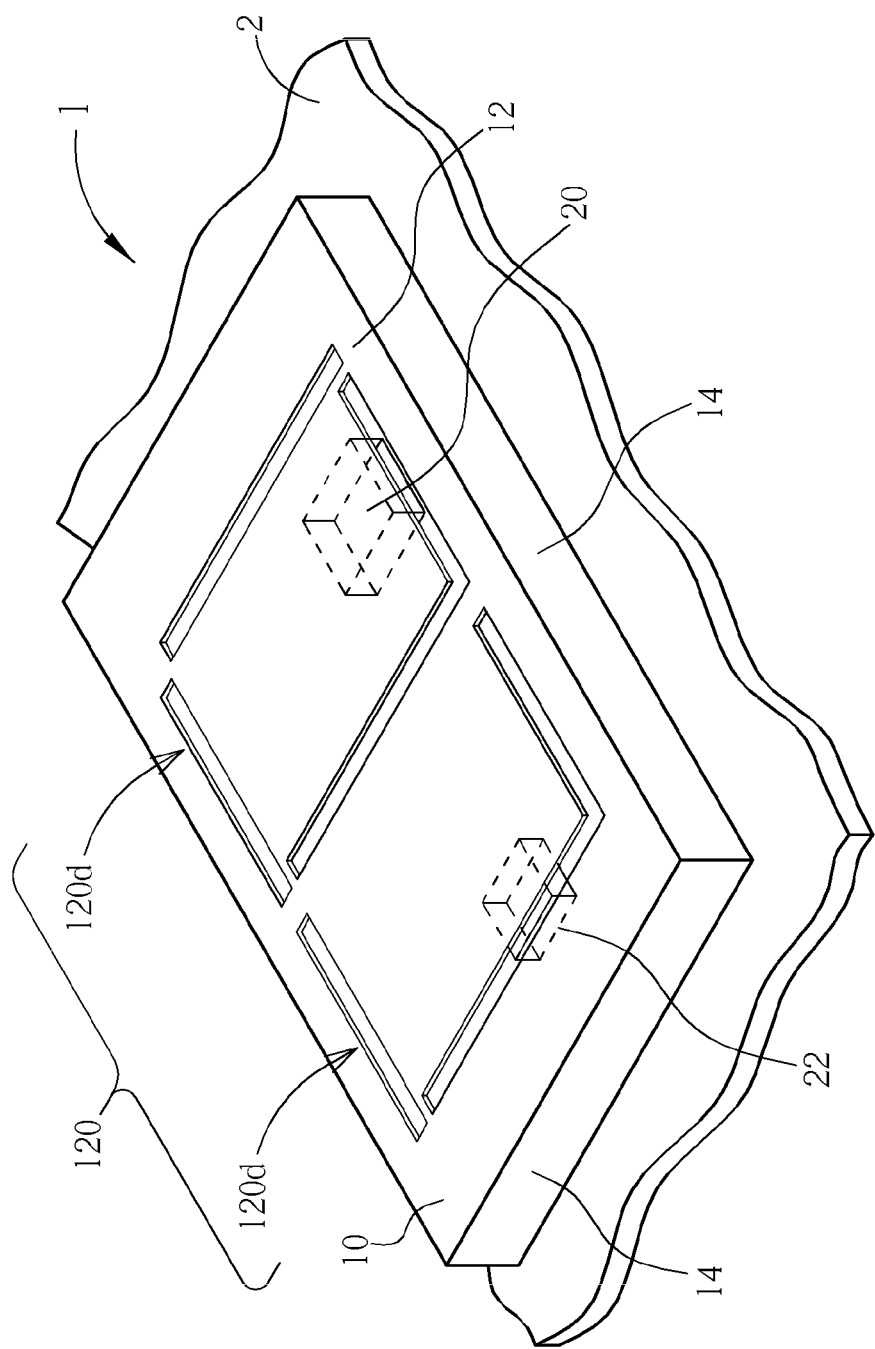

As shown in FIG. 6, another kind of period pattern, such as the mirror-symmetric patterns 120c, which are formed by meandered openings, are provided on the top piece 12 of the shield body 10. As shown in FIG. 7, a plurality of straight-line-shaped openings and a plurality of L-shaped openings constitute periodic patterns 120d. It is noteworthy that the openings shown through FIGS. 1-7 may further comprise grid structure or mesh structure therein. Moreover, according to another embodiment of this invention, the EBG structure 120 may be formed on the sidewall pieces 14 of the shield body 10 depending upon the design requirements.

Figure 8:
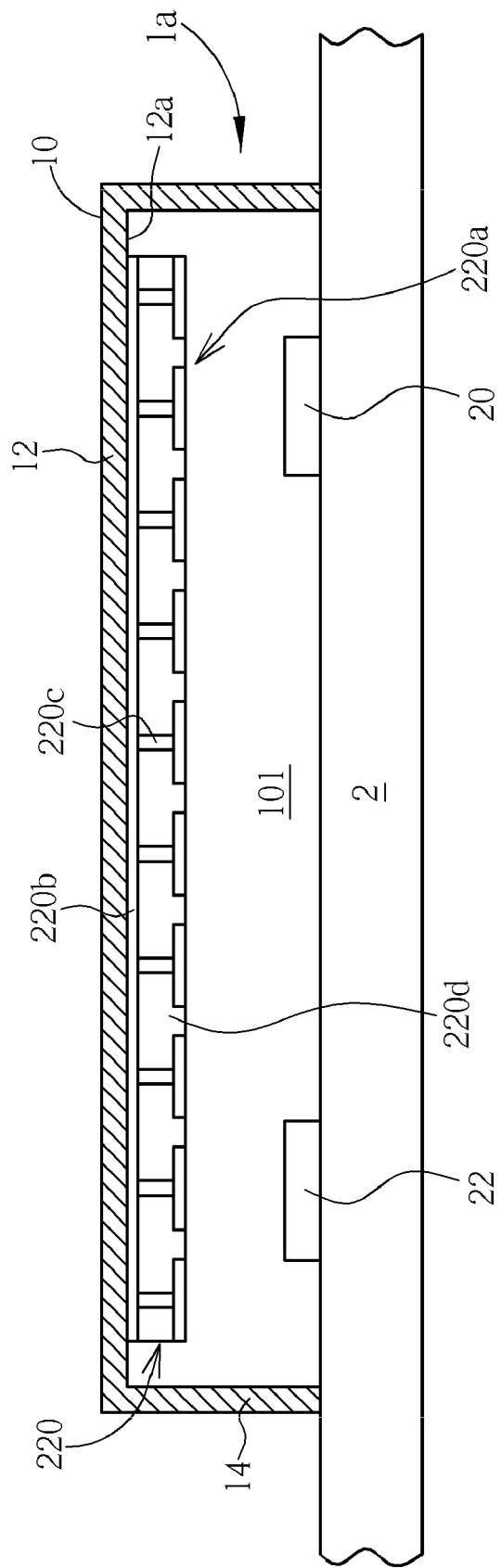
FIG. 8 is a schematic, cross-sectional diagram illustrating a shielding device in accordance with another embodiment of the invention.

FIG. 8 is a schematic, cross-sectional diagram illustrating a shielding device in accordance with another embodiment of the invention, wherein like numeral numbers designate like elements, parts, regions or layers. As shown in FIG. 8, the shielding device 1a includes a monolithic shield body 10 having a top piece 12 and four sidewall pieces 14. The shield body 10 is a downwardly opened, box-like structure. The top piece 12 and the sidewall pieces 14 define a single covering space (or single compartment) 101 for shielding at least two RF electronic components 20 and 22 that are mounted on a PCB 2. For example, the RF electronic component 20 may be an RF power amplifier and the RF electronic component 22 may be an RF transceiver. In another case, the RF electronic component 22 may be embedded in an SOC chip, which further comprises a baseband circuit. For the sake of simplicity, merely the RF electronic components 20 and 22 are shown while the other parts on the PCB 2 are omitted.

The shield body 10 may be manufactured by one piece of sheet metal by common manufacturing techniques including but not limited to stamping, folding and drawing. Moreover, in one example, the shield body 10 can be electrically connected to a ground plane (not shown) of the PCB 2, e.g. a system ground. The shielding device 1a may be affixed on a selected portion of the PCB 2 using methods known in the art, for example, soldering, welding, bonding, gluing or other suitable affixation means. In addition, the shielding device 1a may be a one-piece structure or a multiple-piece structure. In a case that the shielding device 1a is a two-piece structure, a receiving member may be provided to fit to the shield body 10. For example, the receiving member may have legs penetrating through corresponding slits formed in the PCB 2, which engage with the shield body 10.

An EBG structure 220, which is substantially a metal-insulator-metal structure, is externally mounted on an inner surface 12a of the top piece 12 of the shield body 10 for mitigating electromagnetic interference between the RF electronic components 20 and 22 that are both placed within and shielded by the same covering space 101 of the shielding device 1. According to the embodiment of this invention, the EBG structure 220 can be easily implemented by a dummy PCB having at least one layer of periodic metal patch array 220a directly facing the RF electronic components 20 and 22. The dummy PCB may be affixed on the inner surface 12a using methods known in the art, for example, soldering, welding, bonding, gluing or other suitable affixation means. By virtue of the combination of different mediums including conductor (metal) and insulator (air), the EBG structure 220 affects the resonant modes of the shielding cavity, e.g. the shield body.

Moreover, the EBG structure 220 may further a layer of metal layer 220b directly facing the inner surface 12a of the top piece 12. The metal layer 220b may be electrically connected with the shield body 10 that is grounded through the ground plane of the PCB 2. In addition, the metal layer 220b may be electrically connected with the layer of periodic metal patch array 220a through vias 220c. The layer of periodic metal patch array 220a, the metal layer 220b and the vias 220c may be fabricated on a dielectric substrate 220d using conventional PCB manufacturing processes. According to this embodiment, the EBG structure 220 may be formed on the sidewall pieces 14 of the shield body 10 depending upon the design requirements.

Alternatively, the metal layer 220b can be omitted according to another embodiment. That is, the layer of periodic metal patch array 220a can be electrically connected to the top piece 10 of the shield body 1a through the vias 220c. Similarly, the metal layer 220b and the vias 220c in this embodiment may be fabricated on a dielectric substrate 220d using conventional PCB manufacturing processes.

Figure 9:
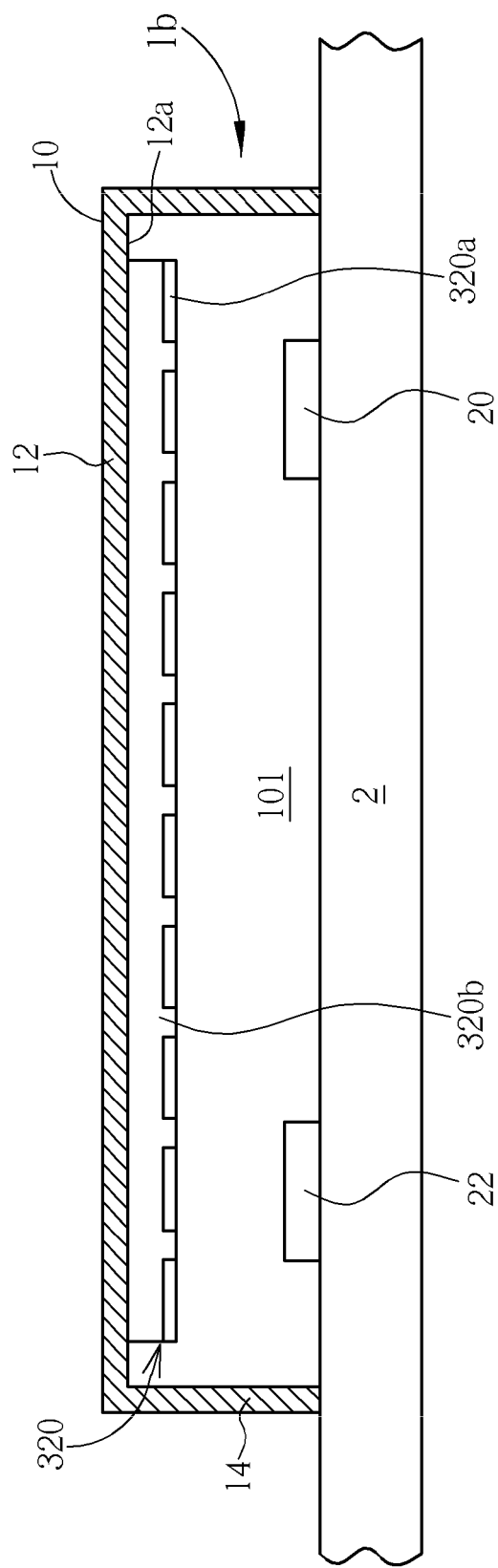
FIG. 9 is a schematic, cross-sectional diagram illustrating a shielding device in accordance with still another embodiment of the invention.

FIG. 9 is a schematic, cross-sectional diagram illustrating a shielding device in accordance with still another embodiment of the invention, wherein like numeral numbers designate like elements, parts, regions or layers. As shown in FIG. 9, the shielding device 1b includes a monolithic shield body 10 having a top piece 12 and four sidewall pieces 14. The shield body 10 is a downwardly opened, box-like structure. The top piece 12 and the sidewall pieces 14 define a single covering space (or single compartment) 101 for shielding at least two RF electronic components 20 and 22 that are mounted on a PCB 2. For example, the RF electronic component 20 may be an RF power amplifier and the RF electronic component 22 may be an RF transceiver. In another case, the RF electronic component 22 may be embedded in an SOC chip, which further comprises a baseband circuit. For the sake of simplicity, merely the RF electronic components 20 and 22 are shown while the other parts on the PCB 2 are omitted.

The shield body 10 may be manufactured by one piece of sheet metal by common manufacturing techniques including but not limited to stamping, folding and drawing. Moreover, in one example, the shield body 10 can be electrically connected to a ground plane (not shown) of the PCB 2, e.g. a system ground. The shielding device 1b may be affixed on a selected portion of the PCB 2 using methods known in the art, for example, soldering, welding, bonding, gluing or other suitable affixation means. In addition, the shielding device 1b may be a one-piece structure or a multiple-piece structure. In a case that the shielding device 1b is a two-piece structure, a receiving member may be provided to fit to the shield body 10. For example, the receiving member may have legs penetrating through corresponding slits formed in the PCB 2, which engage with the shield body 10.

An EBG structure 320, which is substantially an insulator-metal structure, is externally mounted on an inner surface 12a of the top piece 12 of the shield body 10 for mitigating electromagnetic interference between the RF electronic components 20 and 22 that are both placed within and shielded by the same covering space 101 of the shielding device 1b. According to the embodiment of this invention, the EBG structure 320 has one layer of periodic metal patch array 320a directly facing the RF electronic components 20 and 22. The layer of periodic metal patch array 320a is affixed onto the inner surface 12a using an adhesive layer 320b. The adhesive layer 320b may comprise conductive glues including but not limited to silver epoxy resins. According to this embodiment, the EBG structure 320 may be formed on sidewall pieces 14 of the shield body 10 depending upon the design requirements.

Those skilled in the art will readily observe that numerous modifications and alterations of the device and method may be made while retaining the teachings of the invention.

What is claimed is:

1. A printed circuit board with shielding protection, the printed circuit board comprising:
   a substrate;
   an electronic component on the substrate;
   a shield body having a top piece and a plurality of sidewall pieces defining a covering space for shielding the electronic component on the substrate; and
   an electromagnetic band-gap (EBG) structure disposed on the top piece, wherein the EBG structure is arranged to modify resonant modes of the shield body within a range of frequencies.

2. The printed circuit board according to claim 1 wherein the shield body is electrically connected to system ground.

3. The printed circuit board according to claim 1 wherein the EBG structure comprises a periodic pattern.

4. The printed circuit board according to claim 3 wherein the periodic pattern comprises at least two spiral openings.

5. The printed circuit board according to claim 3 wherein the periodic pattern comprises at least two linear openings.

6. The printed circuit board according to claim 3 wherein the periodic pattern comprises at least one metal strip disposed on an inner surface of the top piece.

7. The printed circuit board according to claim 6 wherein the metal strip is affixed onto the inner surface of the top piece using an adhesive layer.

8. The printed circuit board according to claim 6 wherein the metal strip is connected to the inner surface of the top piece through studs.

9. The printed circuit board according to claim 1 wherein the EBG structure comprises a dummy printed circuit board (PCB) affixed onto an inner surface of the top piece.

10. The printed circuit board according to claim 1 wherein the shielding device is a one-piece structure of the top piece and the sidewall pieces.

11. The shielding device according to claim 1 wherein the range of frequencies is a function of the geometrical features of the EBG structure, wherein the geometrical features comprises periodicity, opening size, and relative position of the EBG structure.

12. A printed circuit board with shielding protection, the printed circuit board comprising:
    a substrate;
    an electronic component on the substrate; and
    a shielding device comprising;
      a shield body having a top piece and a plurality of sidewall pieces, wherein the top piece and the plurality of sidewall pieces define a covering space for shielding the electronic component on the substrate; and
      an electromagnetic band-gap (EBG) structure on the top piece, the EBG structure comprising a periodic pattern capable of preventing propagation of electromagnetic waves within a range of frequencies.

13. The printed circuit board with shielding protection according to claim 12 wherein the shield body is electrically connected to system ground.

14. The printed circuit board with shielding protection according to claim 12 wherein the periodic pattern comprises at least two spiral openings.

15. The printed circuit board with shielding protection according to claim 12 wherein the periodic pattern is a linear opening.

16. The printed circuit board with shielding protection according to claim 12 wherein the EBG structure comprises at least one metal strip disposed on an inner surface of the top piece.

17. The printed circuit board with shielding protection according to claim 16 wherein the metal strip is affixed onto the inner surface of the top piece using an adhesive layer.

18. The printed circuit board with shielding protection according to claim 16 wherein the metal strip is connected to the inner surface of the top piece through studs.

19. The printed circuit board with shielding protection according to claim 12 wherein the EBG structure comprises a dummy printed circuit board (PCB).

20. The printed circuit board with shielding protection according to claim 12 wherein the electronic component is a radio frequency (RF) electronic component, an RF power amplifier or an RF transceiver.

21. The printed circuit board with shielding protection according to claim 12 wherein the shielding device is a one-piece structure of the top piece and the sidewall pieces.

22. The shielding device according to claim 12 wherein the range of frequencies is a function of the geometrical features of the EBG structure, wherein the geometrical features comprises periodicity, opening size, and relative position of the EBG structure.

23. A printed circuit board with shielding protection, the printed circuit board comprising:
    a substrate;
    an RF transceiver on the substrate;
    an RF power amplifier on the substrate; and
    a shielding device comprising;
        a shield body having a top piece and a plurality of sidewall pieces, wherein the top piece and the plurality of sidewall pieces define a covering space for shielding the RF transceiver and the RF power amplifier on the substrate; and
        an electromagnetic band-gap (EBG) structure on the top piece, the EBG structure comprising a periodic pattern capable of preventing propagation of electromagnetic waves within a range of frequencies.

\* \* \* \* \*